US006763486B2

(12) United States Patent
Lai et al.

(10) Patent No.: US 6,763,486 B2
(45) Date of Patent: Jul. 13, 2004

(54) METHOD AND APPARATUS OF BOUNDARY SCAN TESTING FOR AC-COUPLED DIFFERENTIAL DATA PATHS

(75) Inventors: Benny W H Lai, Fremont, CA (US); Young Gon Kim, Santa Clara, CA (US); Kenneth P Parker, Ft Collins, CO (US); Jeff Rearick, Ft Collins, CO (US)

(73) Assignee: Agilent Technologies, Inc., Palo Alto, CA (US)

(*) Notice: Subject to any disclaimer, the term of this patent is extended or adjusted under 35 U.S.C. 154(b) by 555 days.

(21) Appl. No.: 09/851,731

(22) Filed: May 9, 2001

(65) Prior Publication Data

US 2002/0170011 A1 Nov. 14, 2002

(51) Int. Cl.[7] ............................................. G01R 31/317
(52) U.S. Cl. ............................ 714/727; 700/21; 700/79
(58) Field of Search ......................... 714/6–7, 11, 727; 700/21, 79–82, 54, 71

(56) References Cited

U.S. PATENT DOCUMENTS 6,490,325 B1 * 12/2002 Fiedler et al. ............... 375/257
6,662,134 B2 * 12/2003 Moore ......................... 702/117
2002/0076034 A1 * 6/2002 Prabhu et al. ............ 379/390.02

OTHER PUBLICATIONS

Young Kim; Lai, B.; Parker, K.P.; Rearick, J.; Frequency detection–based boundary–scan testing of AC coupled nets; Test Conference, 2001. Proceedings. International, Oct. 31–Nov. 1, 2001; pp.: 46–53.*

* cited by examiner

Primary Examiner—R. Stephen Dildine
(74) Attorney, Agent, or Firm—Pamela Lau Kee

(57) ABSTRACT

Boundary scan testing methods that detect manufacturing defects in AC-coupled differential pairs may be based on a selected signal parameter: phase or frequency. The data is encoded by the signal parameter. In one embodiment, the signal parameter is compared to reference parameter data provided by the transmitter. In a second embodiment, the reference parameter data is sent from an external source. All the components on board are synchronized with this external source. In a third embodiment, the reference parameter data is embedded in each AC signal between the transmitter and receiver. Two lines of one differential link are used to send different patterns.

19 Claims, 6 Drawing Sheets

METHOD AND APPARATUS OF BOUNDARY SCAN TESTING FOR AC-COUPLED DIFFERENTIAL DATA PATHS

BACKGROUND

In the printed circuit board assembly process, wherein many components are soldered down, a method for continuity testing was devised to isolate defects on the board to enhance yields and lower the costs. In this test mode, the individual outputs of a component are preset to known states, and corresponding inputs are detected for these states. Defects such as opens or shorts to voltage supply or adjacent lines are detected with the patterns received. This testing is done at a sufficiently low frequency where signal integrity is not an issue. This method, known as JTAG boundary scan, has been adopted as an industry standard as IEEE 1149.1 and also IEEE 1149.4.

In a high-speed PC board assembly, the fastest signals are typically AC-coupled through series capacitors, enabling components with different technologies and supply voltages to be interfaced. As the boundary scan standard was not designed for AC connected signals, these signals are not testable with IEEE 1149.1.

Recently, the number of AC-coupled signals has increased dramatically and defects on these untestable signal paths have greatly impacted board yields. Thus, a method of boundary scan testing for these AC-coupled data paths needs to be developed to address this problem.

AC-coupled high-speed signal paths are increasingly transmitted as differential pairs to maximize signal integrity. This has the undesirable effect of masking many common defects, such as open solder joints. Masking occurs when a defect in one leg of a differential pair does not prevent information from being transmitted on the other at lower speeds. However, the high frequency performance of this path is unacceptably degraded.

The boundary scan testing methodology allows Inputs and Outputs ports of an IC to be isolated from the internal core logic, and allows these ports to be observed and controlled during the boundary scan tests via registers. The values of the registers of the output ports are sequentially loaded and set to a known state. The values of the registers of the input ports are read sequentially, and are compared to their expected values by the tester. A test clock is used to toggle the states of these registers in and out of the chip under test.

SUMMARY

The present invention is boundary scan testing methods that detect manufacturing defects in differential pairs. Boundary scan testing methods that detect manufacturing defects in differential pairs may be based on a selected signal parameter: phase or frequency. The data is encoded by the signal parameter. In one variation, the signal parameter is compared to reference parameter data provided by the transmitter. In a second variation, the reference parameter data is sent or derived from an external source. All the components on board are synchronized with this external source. In a third variation, the reference parameter data is embedded in each AC signal between the transmitter and receiver. Two lines of one differential link are used to send different patterns.

In a first embodiment of a timing-based solution, the data is encoded into phase information of a repetitive pulse signal of 50% duty cycle. A logic "1" can be encoded as a 0° phase-shifted pulse and a logic "0" can be encoded as a 180° phase-shifted pulse. The pulse frequency needs to be high enough to pass through the AC coupling capacitors. To receive and detect exact phase information, the receiver (RX) needs to have reference phase information.

The second embodiment of a timing-based solution identifies multiple reference sources in one transmission. The reference phase information is sent from an external source. All the components on board are synchronized with this external source. The phase-shifted pulses can be generated according to this external source and also can be detected using the same external source. Multiple chip connections can be handled, as there is one global reference. However, an external global reference generator and one additional pin to each component are required.

The third embodiment of the timing-based solution also identifies multiple reference sources in one transmission. The reference phase information is embedded in each AC signal. Two lines of one differential link are used to send different patterns. Each line refers to the other line as a reference. In the receiver side, one line can recover the data using the other line as a clock and vice versa. The global reference is eliminated and each differential link is treated independently. However, this method requires two lines for proper testing.

The frequency-based solution of the present invention uses different frequencies instead of different phases of an AC signal. The logic "1" can be converted to $f_1$ frequency signal and data zero may be converted to $f_0$ frequency signal; both $f_1$ and $f_0$ frequency signals are ideally 50% duty cycle. On the receiver side, a frequency detector can detect the frequency of received signals. In general, a frequency detector needs a reference frequency to know whether the received frequency is higher or lower than the reference. So, in a frequency-based solution, a reference frequency is needed.

In a generic frequency-based solution, a transmitter output driver and a receiver input buffer are interposed by a pair of coupling capacitors. A frequency encoder provides input to the transmitter. A frequency generator receives a global source frequency, $f_g$ and generates a high frequency corresponding to a logic HIGH $f_1$, a low frequency corresponding to a data ZERO $f_0$, and a reference frequency $f_{REF}$. During test, the frequency encoder receives the high and low frequencies and the incoming data. The incoming data is mapped into signals of high and low frequencies and then applied to the transmitter. At the receiver, these signals are compared to a reference frequency, and are decoded back to the initial datastream.

In a first embodiment of the frequency-based embodiment, the reference frequency is sent from the transmitter side. The received reference frequency is used to detect the received signal frequency on the receiver side. However, similar to the first embodiment of the time-based solution, when multiple reference sources are in the transmission is difficult to determine which one is the exact reference.

In a second embodiment of the frequency-based solution, the reference frequency can be sent or derived from an external source clock. All the components on board have the same reference frequency to detect the received signal. The frequency detector uses this reference frequency to decide the frequency of the received signal. This embodiment is the frequency corollary to the second embodiment of the timing-based solution.

In the third embodiment of the frequency-based solution, the reference frequency information can be embedded in each link. The two different frequencies can be sent through two lines in one differential link. On the receiver side, one line's frequency detector uses the other line's received signal as a reference frequency and vice versa. This embodiment is the frequency corollary to the third embodiment of the timing-based solution.

DETAILED DESCRIPTION

Figure 1:
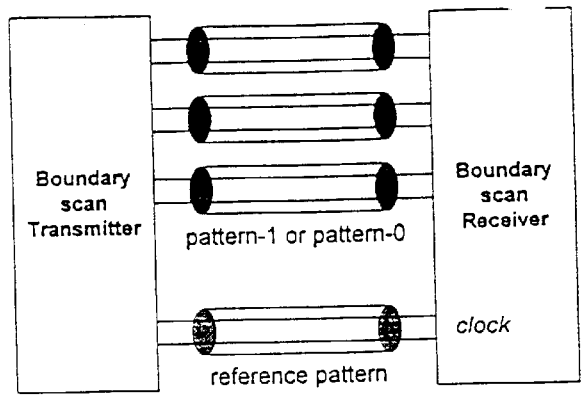
FIG. 1 illustrates a timing-based solution according to the present invention.

FIG. 1 illustrates a timing-based solution according to the present invention. The data can be encoded into phase information of a repetitive pulse of 50% duty cycle. To illustrate, a logic "1" can be encoded as a 0° phase-shifted pulse and a logic "0" can be encoded as a 180° phase-shifted pulse. In this figure, a logic "1" is denoted as "pattern-1". Likewise, a logic "0" is denoted as "pattern-0". The pulse frequency needs to be high enough to pass through the AC coupling capacitors. To receive and detect exact phase information, the receiver (RX) needs to have reference phase information, derived from a "reference pattern".

In this embodiment, this reference phase information can be sent from the transmitter (TX) side like a "source synchronous chip-to-chip communication". The TX can send a reference phase information as a clock then the RX latch can retrieve the true data from phase-shifted signal using this reference clock. In this illustration, the clock and AC signals will experience comparable delays. So, the phase error should be minimized. However, this method cannot apply to multiple-chip connections, e.g. systems where there are multiple reference sources in one transmission, it cannot be determined which one is the exact reference.

Figure 2:
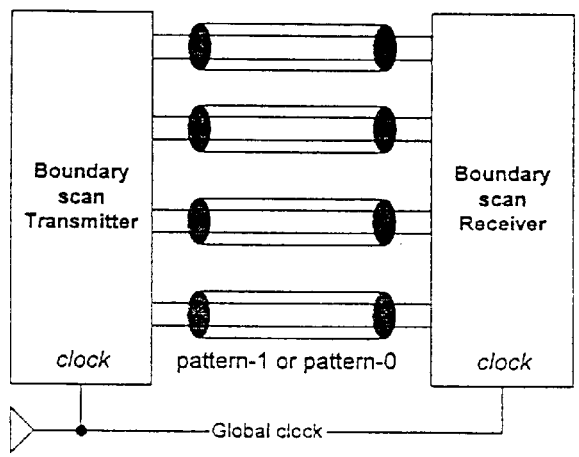
FIG. 2 illustrates an alternate timing-based solution according to the present invention.

FIG. 2 illustrates an alternate timing-based solution according to the present invention. This embodiment resolves the multiple reference sources in one transmission dilemma. The reference phase information is sent from an external source, denoted as the "global clock". All the components on board are synchronized with this external source. The phase-shifted pulses can be generated according to this external source and also can be detected using the same external source. Multiple chip connections can be handled, as there is one global source. An external global source generator and one additional pin to each component are required, which could be shared with an existing system clock pin.

Figure 3:
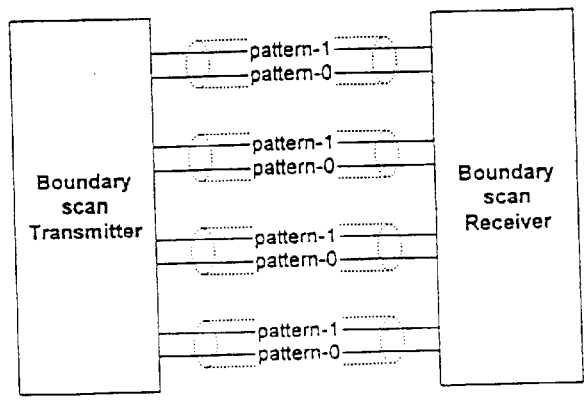
FIG. 3 illustrates an alternate timing-based solution according to the present invention.

FIG. 3 illustrates an alternate timing-based solution according to the present invention. This is an alternate embodiment for resolving the multiple reference sources in one transmission dilemma. The reference phase information is embedded in each AC signal. Two lines of one differential link are used to send different patterns. Each line refers to the other line as a reference. In the receiver side, one line can recover the data using the other line as a clock and vice versa. The global source is eliminated and each differential link is treated independently.

The timing-based solutions are inherently based on phase information. The encoded phase of the transmitted signal is compared with a reference phase with sufficient timing margins. Compounded with the fact that mode dense PCB layout results in pin-to-pin skews, as well as part to part variations, the frequency of the pulse signal needs to be sufficiently low to allow for this margin. Thus, the value of the AC coupling capacitors needs to be increased to support this lower frequency.

For example, for a 1.25 GB/sec Gigabit Ethernet serial link with encoded data, the maximum run length is 5 bits, and most of its frequency spectrum is above 50 MHz. However, the timing constraints imposed by the phase margins of the phase encoded pulse signals may require the lower signal frequency corner to be near 1 MHz, thus imposing a much larger capacitor size than it would normally be needed.

In a frequency-based solution, an AC signal uses different frequencies instead of different phases. To illustrate, the logic "1" can be converted to $f_1$ frequency signal and data zero may be converted to $f_0$ frequency signal. On the receiver side, a frequency detector can detect the frequency of received signals. In general, a frequency detector needs a reference frequency to know whether the received frequency is higher or lower than the reference. So, in frequency-based solution, a reference frequency is needed.

The frequency-based solutions are phase independent. With no timing margins requirements, the frequencies of the transmitted signals could be set to within the normal frequency bandwidth of the serial link, and thus does not impose larger capacitor values to be used.

Figure 4:
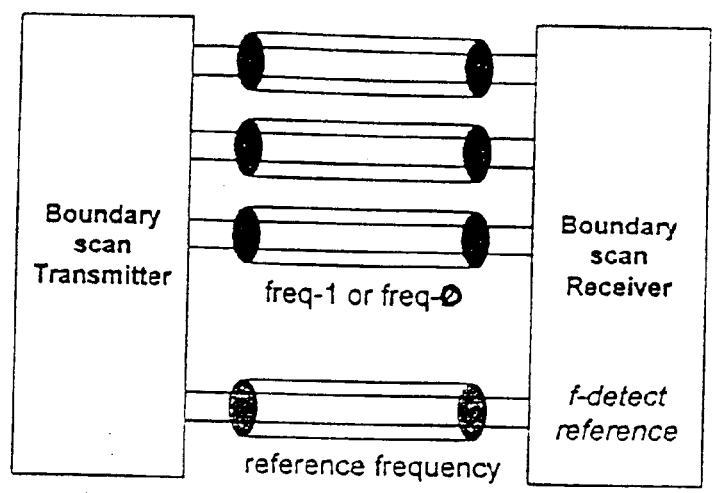
FIG. 4 illustrates a frequency-based solution according to the present invention.

FIG. 4 illustrates a frequency-based embodiment according to the present invention. In this embodiment, the reference frequency is sent from the transmitter side. The received reference frequency is used to detect the received signal frequency on the receiver side. However, similar to the embodiment shown in FIG. 1, when multiple reference sources are in the transmission is difficult to determine which one is the exact reference.

Figure 5:
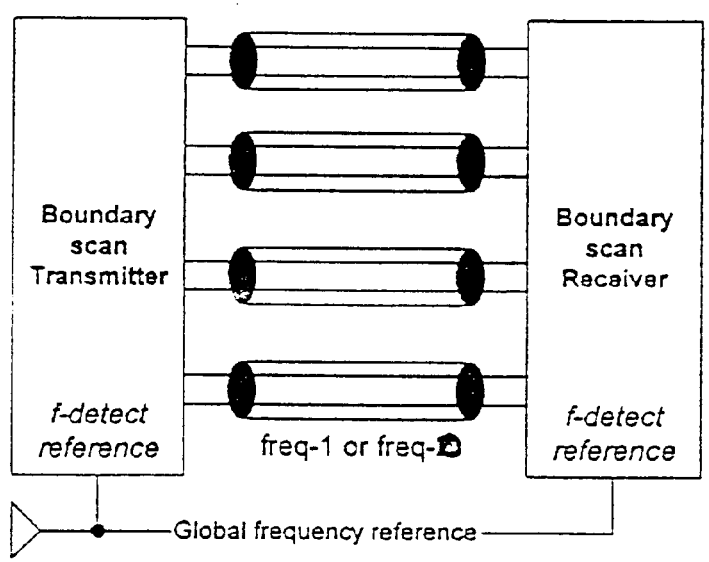
FIG. 5 illustrates an alternate frequency-based solution according to the present invention.

FIG. 5 illustrates an alternate frequency-based embodiment according to the present invention. In this embodiment, the reference frequency can be sent or derived from an external source. All the components on board have the same reference frequency to detect the received signal. The frequency detector uses this reference frequency to decide the frequency of the received signal. This embodiment is the frequency corollary to the timing-based embodiment shown in FIG. 2.

Figure 6:
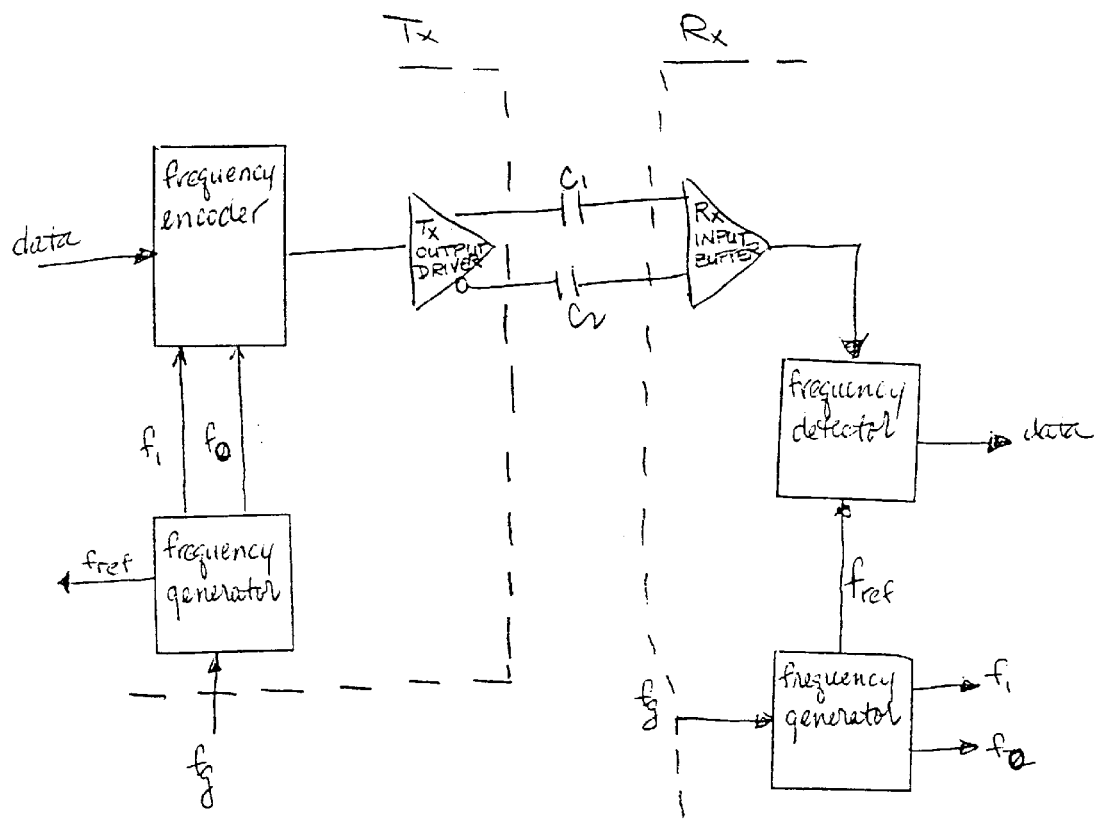
FIG. 6 illustrates a generic block diagram for frequency-based solutions according to the present invention.

FIG. 6 illustrates a frequency-based solution according to the present invention. A pair of coupling capacitors interposes a transmitter output driver and a receiver input buffer. The transmission line terminations and bias circuitry are not shown.

A frequency encoder provides input to the transmitter output driver. A frequency generator receives a global frequency and generates a high frequency corresponding to a logic HIGH $f_1$, a low frequency corresponding to a data ZERO $f_0$, and a reference frequency $f_{REF}$. During test, the frequency encoder receives the high and low frequencies and the incoming data. The incoming data is mapped into high and low frequencies and then applied to the transmitter output driver.

A frequency detector receives the output of the receiver input buffer and the reference frequency. The frequency decoder receives the frequency detector output and translates it back to the binary data. This value is read out sequentially to the tester instrument (not shown), and a comparison is made by software to the original data sent at the transmitter.

Figure 7:
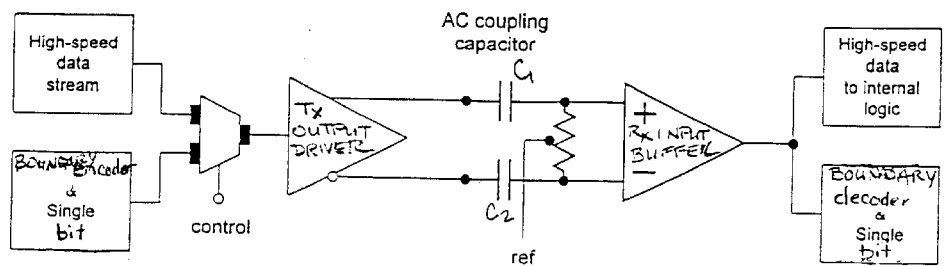
FIG. 7 illustrates an embodiment of the frequency-based solution shown in FIG. 6.

FIG. 7 illustrates an embodiment of the frequency-based embodiment shown in FIG. 6. A differential driving and differential receiving architecture is presented. The Boundary scan register and frequency encoders are located before the differential output driver. The frequency encoder chooses which frequency to send to the output driver based on the logic value of the scan register. Also, the boundary scan receiving logic and register are located after the differential receiver. This allows existing boundary scan testing software to be used unmodified. The boundary scan blocks are located before and after the real differential driver/receiver, and therefore, does not affect the high-speed link.

However, this method cannot detect the one-line failure out of two lines in a differential link. Even if a one-line failure occurs, receiving logic may consider the defective link as a working link. For example, if one line of a differential link is open, the receiver receives "one valid" input and static voltage instead of two valid differential inputs. The receiver cannot discriminate between two valid differential inputs and one valid input/static voltage.

Figure 8:
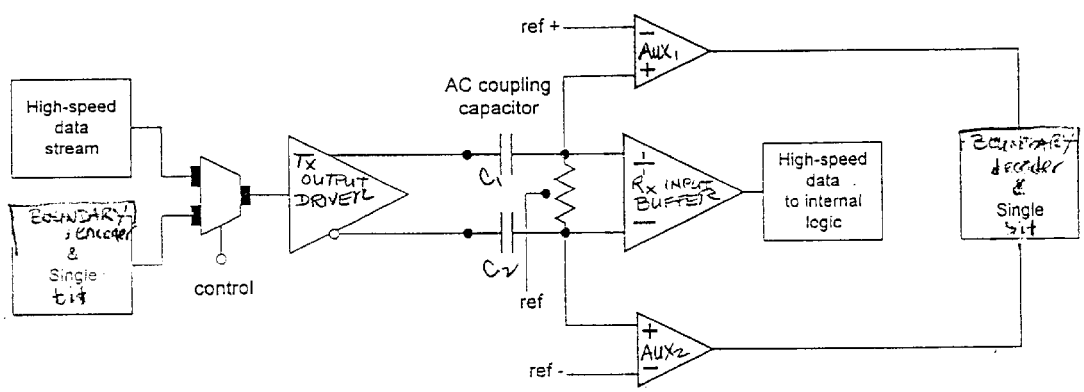
FIG. 8 illustrates an embodiment of the frequency-based solution shown in FIG. 6.

FIG. 8 illustrates an embodiment of the frequency-based solution shown in FIG. 6. This embodiment proposes a differential driving and single-ended receiving architecture. The driving side is similar to that proposed in FIG. 6. On the receiver side, two single-ended auxiliary boundary scan receivers $AUX_1, AUX_2$ are located prior to the receiver input buffer. These boundary scan receivers are connected to the boundary scan logic block. After this logic block, the boundary scan register is connected to it.

Using this method, existing testing software may be used unmodified. The one-line failure can be detected through independent boundary-scan receiver logic. However, this method does not identify the failure of one line out of two differential lines. This method uses only one receiving boundary register for the differential link. There is no way to report individual failure using one register.

Figure 9:
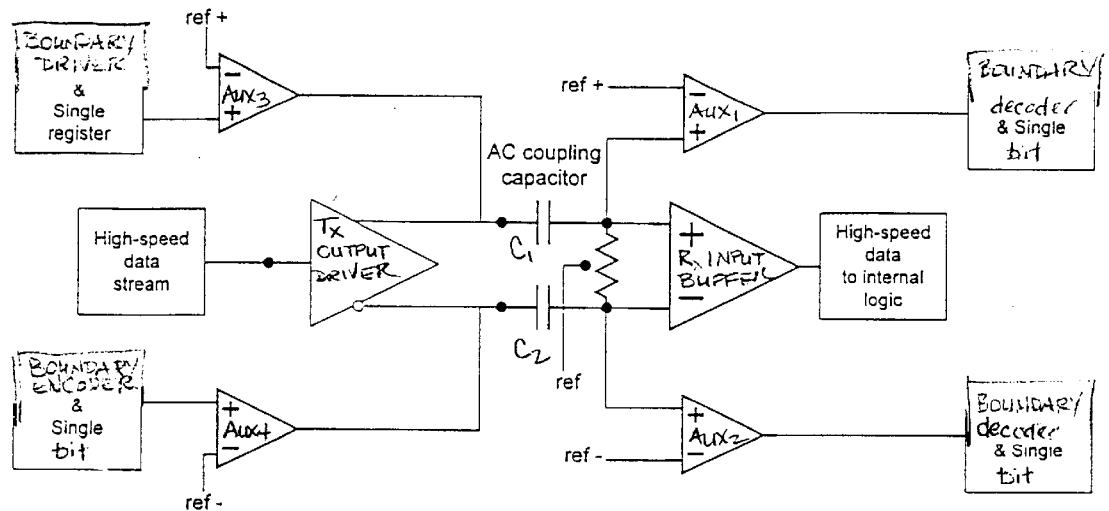
FIG. 9 illustrates an embodiment of the frequency-based solution shown in FIG. 6.

FIG. 9 illustrates an embodiment of the frequency-based solution shown in FIG. 6. This embodiment uses a single-ended driving and single-ended receiving architecture. The differential link is treated as two independent single lines. Two independent boundary scan drivers $AUX_3, AUX_4$ are connected to each line and two auxiliary boundary scan receivers $AUX_1, AUX_2$ are also connected in receiver side.

The differential link is not differential any more in testing mode. Two lines are treated as independent lines and can be tested using existing software without modification. In this embodiment, the normally differential output driver must also be able to drive each of the two lines independently, or alternately, the main output driver would need to be set into an high-impedance state, and two additional single-ended boundary scan drivers need to tap into the link. For high-speed serial links, the output driver design is one of the most challenging, as it needs to operate at the maximum bit rate possible. Additional parasitic loading from the boundary scan drivers will cause degradation in the link performance. Also, non-differential drive would lead to increased common-mode noise on the power supply.

Figure 10:
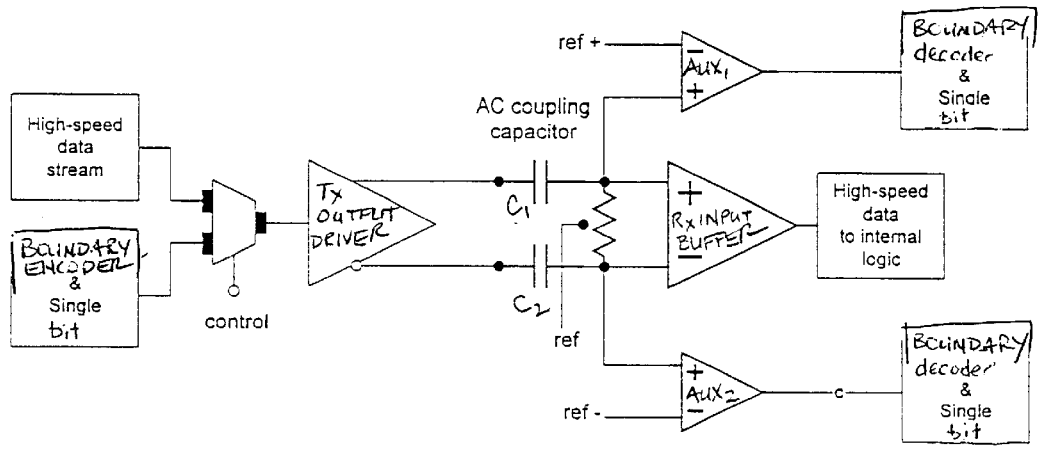
FIG. 10 illustrates an embodiment of the frequency-based solution shown in FIG. 6.

FIG. 10 illustrates an embodiment of the frequency-based solution shown in FIG. 6. This embodiment uses differential driving and single-ended receiving with two different registers to resolve both problems, that is, driver loading and receiver ambiguity. The one boundary scan cell and driver is located before the differential output driver. On the receiver side, two lines of one differential link are treated as independent single-ended lines and are sensed with boundary scan receivers $AUX_1, AUX_2$. Two boundary scan registers and also two logic blocks are used in one differential link. This method requires new testing software but it does not affect the link performance and can detect and identify a one-line failure.

Figure 11:
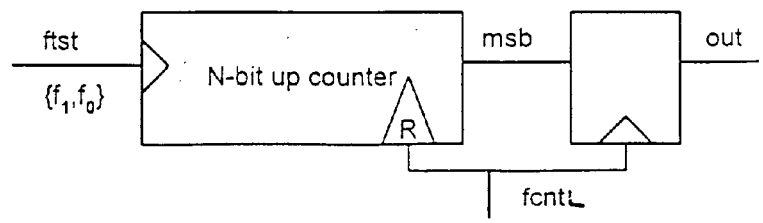
FIG. 11 illustrates a block diagram of the frequency detector shown in FIG. 6.

FIG. 11 illustrates a schematic diagram of the frequency detector shown in FIG. 4. One suitable frequency detector is an up counter with reset. The input of this circuit is the output of the auxiliary scan receiver, which will be (in a defect-free board) either $f_1$ or $f_0$. This signal is used to increment the counter, and a derived clock $f_{CNTL}$ is used to sample the most significant bit of that counter into a flip-flop, and to reset the counter to repeat the cycle. The number of bits in the counter determines the length of the discrimination cycle. Larger numbers offer more noise immunity. An analogy is a measurement of the input frequency clocked with a stopwatch.

In the presence of board manufacturing defects, the output signal of the auxiliary boundary scan receivers may arrive in some distorted condition at the input of the frequency detector. The detector is capable of distinguishing the global frequency $f_g$ from the low frequency $f_0$, but the distorted output signal may be neither of these. In fact, many defects (such as opens, stuck-at faults, and some shorts) will manifest themselves as no signal at all. In these cases, the frequency detector must produce a deterministic and consistent output, such that a sequence of tests that expect both 0s and 1s will detect a failure in one of the two states. To this end, the output of the auxiliary boundary scan receivers must be deterministic when the input signal is absent. An input offset voltage could be added to this auxiliary receiver to accomplish this.

Figure 12:
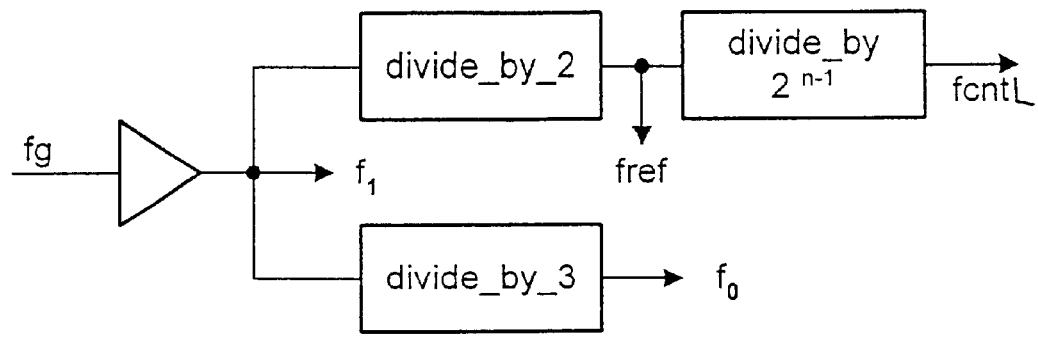
FIG. 12 illustrates a block diagram of the frequency detector shown in FIG. 6.

FIG. 12 illustrates a block diagram of the frequency generator shown in FIG. 4. Four frequencies are derived from a single global frequency $f_g$: $f_1$, $f_0$, $f_{REF}$, and $f_{CNTL}$. The salient features are the relative primeness of $f_1$ and $f_0$ to $f_{REF}$ and the fact that $f_1 > f_{REF} > f_0$, which allows the frequency detectors to clearly differentiate a frequency higher or lower than the reference frequency and thus unambiguously map them into a 1 or a 0. This clock generation circuit may be shared for the AC Boundary Scan pads on an integrated circuit (IC). The $f_{CNTL}$ signal is used to periodically reset the frequency detector counter (to define the starting point of a discrimination cycle) and to capture the most significant bit of the counter to indicate whether $f_1$ or $f_0$ has been detected in a discrimination cycle. The ratio of the high, low, and reference frequencies $f_1:f_{REF}:f_0$ may be 2:3:4.

Figure 13:
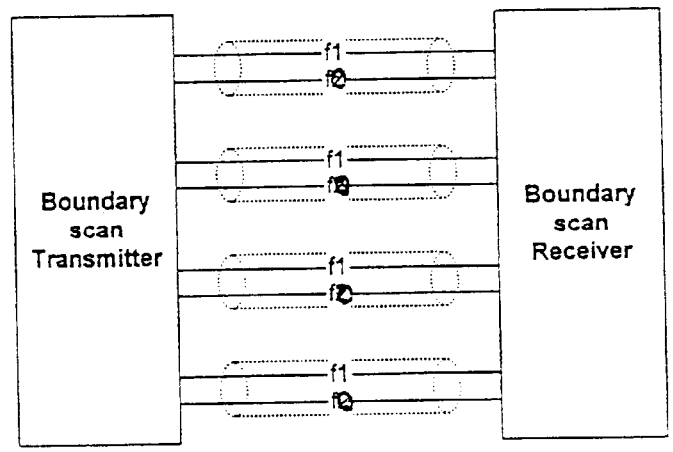
FIG. 13 illustrates an alternate frequency-based solution according to the present invention.

FIG. 13 illustrates an alternate frequency-based solution according to the present invention. The reference frequency information can be embedded in each link. The two different frequencies can be sent through two lines in one differential link. On the receiver side, one line's frequency detector uses the other line's received signal as a reference frequency and vice versa. This embodiment is the frequency corollary to the timing-based embodiment shown in FIG. 3.

We claim:

1. An apparatus for boundary testing comprising:

an encoder, receiving data, encoding data according to a signal parameter;

a transmitter output driver, having first and a second differential output, receiving the encoded data;

a first capacitor connected to first differential output;

a second capacitor connected to the second differential output;

a receiver input buffer, having a first differential input connected to the first capacitor, having a second differential input connected to the second capacitor, generating an output signal;

a decoder, receiving the output signal and generating a decoded signal according to the signal parameter; and a signal parameter comparator, comparing the decoded signal to a reference signal parameter.

2. An apparatus, as defined in claim 1, wherein the signal parameter is phase.

3. An apparatus, as defined in claim 2, wherein the signal parameter comparator compares the decoded signal to reference phase data.

4. An apparatus, as defined in claim 3, wherein the transmitter provides the reference phase data.

5. An apparatus, as defined in claim 2, wherein the signal parameter comparator compares the decoded signal to reference phase data embedded in the data.

6. An apparatus, as defined in claim 1, wherein the signal parameter is frequency.

7. An apparatus, as defined in claim 6, wherein the signal parameter comparator compares the decoded signal to reference frequency data.

8. An apparatus, as defined in claim 7, wherein:

the reference frequency is a global frequency, the transmitter further including, a clock generator generating the global frequency, and a frequency mapper, receiving the global frequency, generating a high frequency, a low frequency, and a reference frequency; and the receiver further including auxiliary input receivers, using a voltage reference related to the bias voltage of the receiver input buffer.

9. An apparatus, as defined in claim 8, wherein the high and low frequencies are relative primes with respect to the reference frequency.

10. An apparatus, as defined in claim 9, wherein the ratio of the high, reference, low frequencies is a:b:c, where a>b>c, and a and c are relatively prime to b.

11. An apparatus, as defined in claim 9, wherein the ratio of the high, reference, low frequencies is 2:3:4.

12. An apparatus, as defined in claim 8, wherein the auxiliary input receivers is a differential pair with one end biased to the bias point of the receiver input buffer.

13. An apparatus, as defined in claim 12, wherein a reference input of each auxiliary input receiver is biased at an offset from the receiver input buffer when the input is open.

14. An apparatus, as defined in claim 8, wherein the frequency detector is an up counter with reset.

15. A method for boundary testing comprising the steps of:

encoding test data according to a signal parameter;

transmitting test data across an AC-coupled network;

receiving the transmitted data;

decoding the transmitted data; and comparing the test data and reference data.

16. A method, as defined in claim 15, wherein the reference data is a separate signal.

17. A method, as defined in claim 16, wherein the signal parameter is selected from a group that includes phase and frequency.

18. A method, as defined in claim 15, wherein the reference data is embedded in the test data.

19. A method, as defined in claim 18, wherein the signal parameter is selected from a group that includes phase and frequency.

* * * * *